US005497053A

United States Patent [19]
Tang et al.

[11] Patent Number: 5,497,053
[45] Date of Patent: Mar. 5, 1996

[54] MICRO-ELECTRON DEFLECTOR

[75] Inventors: Cha-Mei Tang, Potomac; Antonio C. Ting, Silver Spring, both of Md.; Thomas A. Swyden, Falls Church, Va.

[73] Assignee: The United States of America as represented by the Secretary of the Navy, Washington, D.C.

[21] Appl. No.: 151,678

[22] Filed: Nov. 15, 1993

[51] Int. Cl.[6] .............................. G09G 1/04; H03F 3/54; G21K 1/08
[52] U.S. Cl. .............................. 315/366; 530/44; 530/46; 250/396 R
[58] Field of Search ..................................... 315/366, 382; 313/336; 372/74; 250/396 R; 330/44, 46

[56] References Cited

U.S. PATENT DOCUMENTS

| | | | |
|---|---|---|---|
| 2,449,339 | 9/1948 | Sziklai . | |
| 2,553,735 | 5/1951 | Adler | 250/151 |
| 3,725,803 | 4/1973 | Yoder | 330/46 |
| 3,778,658 | 12/1973 | Harris . | |
| 4,422,045 | 12/1983 | Barnett | 330/4 |
| 4,807,241 | 2/1989 | Berkstresser et al. | 372/40 |
| 4,901,028 | 2/1990 | Gray et al. | 330/54 |
| 4,967,162 | 10/1990 | Barnett et al. | 330/43 |
| 4,987,377 | 1/1991 | Gray et al. | 330/54 |
| 5,003,216 | 3/1991 | Hicks | 313/336 |
| 5,030,895 | 7/1991 | Gray | 315/350 |
| 5,103,145 | 4/1992 | Doran | 315/381 |
| 5,124,664 | 6/1992 | Cade | 330/45 |

OTHER PUBLICATIONS

Tang et al. "Field Emission Arrays—A Potentially Bright Source", Nuclear Inst. & Methods in Physics Res. A318 (1992) pp. 353–357.
Karl R. Spangenberg, *Vacuum Tubes*, (McGraw–Hill Book Co., Inc. 1948), pp. 726–729.
Cha–Mei Tang et al. *Field–emission arrays—a potentially bright source*, pp. 353–357, Nuclear Instruments and Methods in Physics Research A318 (1992).
W. L. Oblinger et al. *Beam Deflection Concept for a Vacuum Microwave Amplifier*, Proceedings of the 4th International Vacuum Microelectronics Conference, Aug. 22–24, 1991, Nagahama Japan.
C. E. Holland et al., *A Study of Field Emission Microtriodes*, IEEE Transactions on Electron Devices. vol. 38 No. 10, Oct. 1991, pp. 2368–2372.

(List continued on next page.)

Primary Examiner—Gregory C. Issing
Attorney, Agent, or Firm—Thomas E. McDonnell; Daniel Kalish

[57] ABSTRACT

An electron deflection device responsive to an electrical input signal for producing an output signal includes a focusing array for producing a collimated electron beam input ribbon in the direction of a propagation axis, the input ribbon being elongated along an array axis perpendicular to the propagation axis, and being relatively thin along a deflection axis perpendicular to the array axis and to the propagation axis. The focusing array is preferably a linear array of gated cold cathode units with lens electrodes. The deflection device further includes first and second electrically conductive deflector faces, forming a deflection region therebetween and being disposed so that the propagation-axis passes through the deflection region. The deflection device further includes means responsive to the input signal for applying time varying potentials to the deflector faces so as to produce a modulated electric field in the deflection region for deflecting the input ribbon over the course of a temporal deflection cycle to produce a continuously modulated output ribbon. The deflection device further includes an anode section responsive to the continuously modulated output ribbon for producing an output signal.

The output signal can be in the form of an electrical output signal or a chopped output ribbon suitable for input to a high power amplifier, such as a klystron, klystrode, traveling wave tube, distributed amplifier or a gigatron, or to a free electron laser.

18 Claims, 10 Drawing Sheets

OTHER PUBLICATIONS

Morris Ettenberg et al., *The Simtron Concept,* IEEE Transaction on Electron Devices, vol. 39, No. 11, Nov. 1992, pp. 2607–2610.

W. B. Herrmannsfeldt, *High–Resolution Simulation of Field Emission,* SLAC–PUB–5217 Mar. 1990.

J. P. Calame et al., *Analysis and Design of Microwave Amplifiers Employing Field–Emitter Array,* J. Appl. Phys. 73(3), 1485–1504 (1 Feb. 1993).

FIG. 2
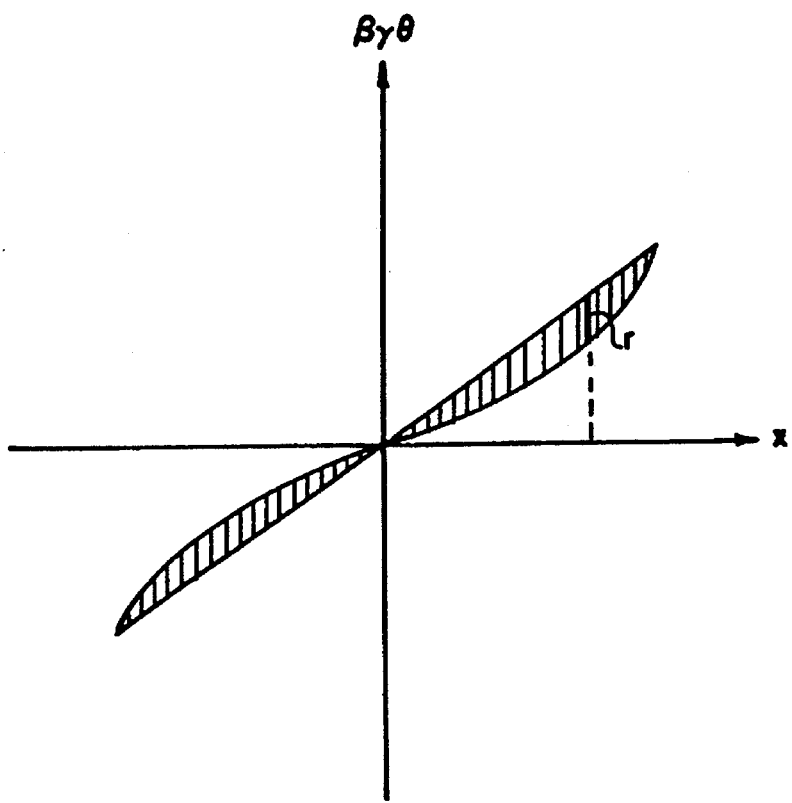
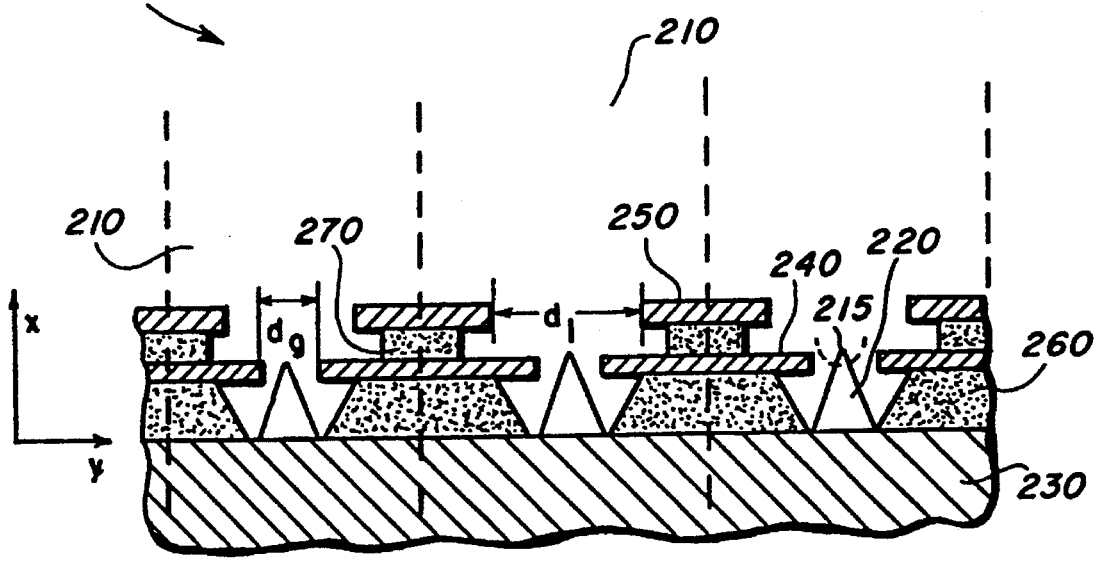
FIG. 3

MICRO-ELECTRON DEFLECTOR

FIELD OF THE INVENTION

The present invention relates to electron beam deflection devices, and more particularly to medium power vacuum deflection amplifiers and to cathodes for production of chopped electron ribbons for power amplifiers in the microwave and millimeter-wave range.

DESCRIPTION OF THE RELATED ART

Deflection control or modulation of electron beams produced by thermionic emission was suggested almost half a century ago. See, Karl R. Spangenberg, "Vacuum Tubes," McGraw-Hill, 1948, §20.11, pages 727–728. However, it was recognized then that such a design had severe shortcomings. Thermionic cathodes do not provide sufficiently high current. Thermionic cathodes have a large velocity spread, thus distorting the response. Other vacuum tube deflector designs which have been proposed are large, precluding efficient operation at high frequency. Some designs require the use of high anode-potentials, thereby reducing the device efficiency.

Cold cathode units now provide for electron beams with higher current density and with lower energy spread than thermionic cathodes. However, previously proposed deflection amplifiers using cold cathodes are inefficient at high frequencies because of their large size, high capacitance, large emittance, high anode voltage, or physical beam interception. Previously proposed designs also fail to provide for high gain over a wide bandwidth or else they are not suitable for use in integrated circuits.

SUMMARY OF THE INVENTION

It is an object of the invention to provide a medium power vacuum deflection amplifier utilizing a high current density, low voltage electron beam produced by cold cathode units.

Another object of the invention is to provide a medium power vacuum deflection amplifier utilizing a high current density, low voltage electron beam produced by cold cathode units, which deflection amplifier is suitable for use at frequencies as high as 40 gigahertz (GHz).

A further object of the invention is to provide a medium power vacuum deflection amplifier utilizing a high current density, low voltage electron beam produced by cold cathode units, which deflection amplifier has high gain over a wide bandwidth at high frequencies.

A still further object of the invention is to provide a medium power vacuum deflection amplifier device utilizing a high current density, low voltage electron beam produced by cold cathode units, which deflection amplifier is an integrated device suitable for use in integrated circuits.

It is also an object of the invention to provide a medium power vacuum deflection modulator utilizing a high current density, low voltage electron beam produced by cold cathode units, which modulator produces a prebunched electron beam suitable for input to a high power amplifier, such as a klystron, traveling wave tube, or distributed amplifier for use at frequencies as high as 80 GHz.

These and other objectives are achieved by an electron deflection device responsive to an electrical input signal for producing an output signal. The deflection device includes a focusing array for producing a collimated electron beam input ribbon in the direction of a propagation axis, the input ribbon being elongated along an array axis perpendicular to the propagation axis, and being relatively thin along a deflection axis perpendicular to the array axis and to the propagation axis. The focusing array is preferably a linear array of gated cold cathode units with lens electrodes. The deflection device further includes first and second electrically conductive deflector faces, forming a deflection region therebetween and being disposed so that the propagation-axis passes through the deflection region. The deflection device further includes means responsive to the input signal for applying time varying potentials to the deflector faces so as to produce a modulated electric field in the deflection region for deflecting the input ribbon over the course of a temporal deflection cycle to produce a continuously modulated output ribbon. The deflection device further includes an anode section responsive to the continuously modulated output ribbon for producing an output signal.

The output signal can be in the form of an electrical output signal or a chopped output ribbon suitable for input to a high power amplifier, such as a klystron, klystrode, traveling wave tube, distributed amplifier or a gigatron, or to a free electron laser.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views, and wherein:

FIG. 2 is a diagram of the x-direction normalized emittance associated with emission from a cold cathode unit of FIG. 1.

FIG. 3 is a side view through the z-y plane of the focusing array of FIG. 1.

DETAILED DESCRIPTION OF THE PREFERRED EMBODIMENT

Figure 1:
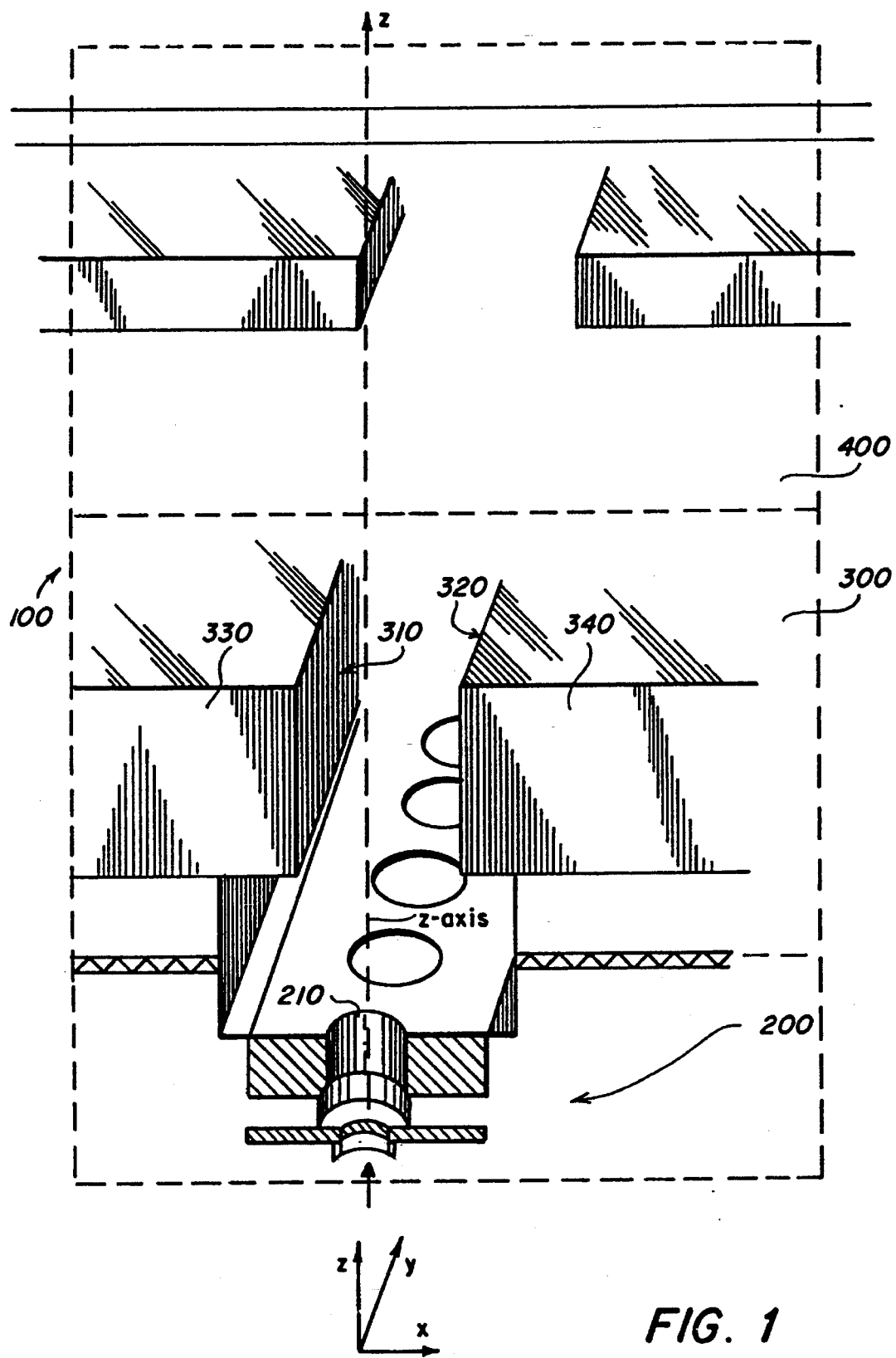
FIG. 1 is a side perspective view of an electron deflection device.

Referring now to the drawings, an electron deflection device 100 responsive to an electrical input signal $I_s$ (not shown) for producing an output signal $U_s$ (not shown) is shown in FIG. 1.

The device 100 includes a focusing array 200 for producing a collimated electron beam input ribbon $R_i$ (not shown). The device 100 further includes a deflection section 300 integrated with the focusing array 200, the deflection section 300 being responsive to the input signal $I_s$ for deflecting the input ribbon $R_i$ to produce a continuously modulated output ribbon $R_{cm}$ (not shown) having a time-varying path. The device 100 further includes an anode section 400 responsive to the continuously modulated output ribbon $R_{cm}$ for producing the output signal $U_s$. The device 100 is preferably encapsulated in a vacuum on the order of $10^{-6}$–$10^{-9}$ Torr.

The focusing array 200 is a linear array of a plurality of cold cathode units 210 disposed along a y-axis. The focusing array 200 produces an input ribbon $R_i$ propagating in the z-direction, that is, upwards as shown in FIG. 1. The x and y axes are orthogonal with respect to the z-direction. The input ribbon $R_i$ is elongated along the y-axis and, as discussed below, is relatively thin in the x-direction.

The focusing array 200 produces a highly collimated input ribbon $R_i$. The trajectories of all electrons in a perfectly collimated beam are parallel to each other. A highly collimated beam has low normalized emittance. As defined in Tang, C. M. et al., "Field-Emission Arrays—a Potentially Bright Source," in "Nuclear Instruments and Methods in Physics Research" A318 (1992) 353–357, North Holland, which is incorporated herein by reference, and as discussed further below, normalized emittance $\epsilon_n$ is determined with reference to a phase space emittance diagram, such as the diagram shown in FIG. 2. The abscissa of FIG. 2 is displacement parallel to the x-axis, and the ordinate is ($\beta \cdot \gamma \cdot \theta$) which is the product of the relativistic factors $\beta$, $\gamma$ and $\theta$, where $$\gamma = \frac{1}{\sqrt{1-\frac{v^2}{c^2}}},$$

$$\beta = \frac{v_z}{c},$$

$$\theta = \frac{v_x}{v_z},$$

c is the speed of light in vacuo, and the vector v having components $v_x$, $v_y$, and $v_z$ is the velocity of electrons emitted from the focusing array 200.

The emittance diagram shown in FIG. 2 is determined for a cold cathode unit 210 with respect to a fixed z-displacement (FIG. 1). As the y-displacement (FIG. 1) is varied for a fixed x-displacement (FIG. 1), the product $\beta \cdot \gamma \cdot \theta$ for each electron falls within a range as shown by the line segment r. The product $\beta \cdot \gamma \cdot \theta$ stays within the range r as the y-displacement is increased, until it reaches a sharp boundary past which there is no further electron emission. The area occupied by the electrons in (x, $\beta \cdot \gamma \cdot \theta$) phase space on this diagram, that is, the area of the shaded propeller-type shape in FIG. 2, is the normalized emittance $\epsilon_n$ in the x-direction. The normalized emittance $\epsilon_n$ (the area) does not vary in the paraxial limit as the z-displacement is varied.

For nonrelativistic propagation of electrons, $\beta \cdot \gamma \cdot \theta \approx v_x/c$. For a given beam x-thickness, the more collimated the input ribbon $R_i$, the smaller the maximum value for $\beta \cdot \gamma \cdot \theta$, and therefore, the more horizontal the shaded shape. A perfectly collimated beam has zero normalized emittance. For purposes of this invention, the normalized emittance in the x-direction associated with the focusing array 200 is on the order of a few $10^{-3}\pi$ millimeter-milliradians (mm-mrad). Normalized emittance of at most $10*10^{-3}\pi$ mm-mrad is considered sufficiently low, but normalized emittance of at most $2*10^{-3}\pi$ mm-mrad is preferable, and normalized emittance of $10^{-3}\pi$ mm-mrad is most preferable. Cold cathode units 210 with normalized emittance as high as $1000*10^{-3}\pi$ mm-mrad (which is less than that obtained from most thermionic cathodes) could also be used, but yield lower gain-bandwidth product and are not as effective at frequencies above 1 GHz.

Collimation is a measure of the extent to which the input ribbon $R_i$ approaches a perfectly collimated beam, that is, an electron ribbon in which the electron trajectories are parallel to each other. As discussed earlier, a highly collimated beam has low normalized emittance. An input ribbon $R_i$ with normalized emittance $\epsilon_n$ of $10^{-3}\pi$ mm-mrad and an x-thickness of 4 micrometers (μm) would be considered highly collimated if it had a collimation angle=arctan($v_x/v_z$) of 5°. Highly collimated beams are capable of being focused to a very thin sheet within this device, thereby enhancing the performance of this deflection device. In fact, the electron deflection device of the present invention serves to keep the electron beam focused to a very thin sheet within this device.

Further desirable specifications of the input ribbon $R_i$ produced by the focusing array 200 are that it have energy on the order of tens of electron volts (eV), preferably below 200 eV and most preferably below 50 eV, with energy spread under 0.2 eV, and that the input ribbon have thickness in the x-direction of under about 200 μm and most preferably under about 10 μm. Furthermore, the input ribbon $R_i$ has current density J between 20 and 1000 Ampere/cm² (A/cm²), preferably on the higher end of this range. In other words, the focusing array 200 preferably produces a high current density input ribbon. Although not absolutely required for the practice of this invention, the total current emitted from the focusing array 200 may be on the order of 1 A. The cold cathode units 210 may be spaced apart in the y-direction by as little as 2 μm. Each cold cathode unit 210 produces a beamlet with up to about 100 micro Amperes (μA) current.

Referring now to FIG. 3, an exemplary focusing array 200 is a vacuum cone-type focusing array. This invention may also be practiced using other cold emitter designs known to persons of ordinary skill in the art, such as one dimensional focusing array wedges (with or without lens electrodes) and one dimensional focusing array edges (with or without lens electrodes).

The focusing array 200 includes a plurality of cold cathode units 210 regularly spaced along the y-axis. Each cold cathode unit 210 emits an electron beamlet (not shown) from the tip 215 of an emitter cone 220 which is mounted on a conducting substrate 230 and is therefore at the same voltage as the substrate 230. The substrate 230 is common to all the cold cathode units 210. The plurality of beamlets emitted by the plurality of cold cathode units 210 constitutes the input ribbon $R_i$.

A gate 240 for extracting the electron beamlet is positioned apart from the emitter cone 220. A first lens electrode 250 for focusing the electron beamlet is positioned above the gate 240. The first lens electrode 250 provides beam collimation, i.e. the voltage gradient between the gate 240 and the first lens electrode 250 results in focusing of the beamlet. The gate 240 and first lens electrode 250 can be circular lenses, linear lenses, or other appropriate designs. The gate 240 need not be a lens. The gate 240 is mounted on an insulating spacer 260 which spacer 260 is thus between the substrate 230 and the gate 240, and the first lens electrode 250 is mounted on an insulating spacer 270 on the gate 240, which spacer 270 is thus between the gate 240 and the first lens electrode 250. The insulating spacers 260 and 270 are typically silicon dioxide ($SiO_2$). Optionally, one or more additional lens electrodes 280 (FIG. 5) may be positioned above the first lens electrode 250 to further focus the beamlet. An example of a double lens electrode design is discussed further below.

The tip 215 has a very small radius of curvature, for example, on the order of 185 Å or less. Upon application of a relatively low electric potential drop between the gate 240 and the emitter cone 220, a high electric field is produced at the tip 215, causing electron emission from the tip 215. The voltage of the tip 215, which is the same as the voltage of the substrate 230, is considered the reference voltage herein. The emitter cone 220 need not be heated as thermionic cathodes must be, and in fact it may be operated at room temperature. Electrons are continuously extracted from the emitter cone 220 by application of a constant positive dc voltage to the gate 240, which is positioned near the tip 215. The focusing array 200 is designed so that the emitted electrons do not intercept either of the insulator spacers 260 and 270. As is known in the art, cold cathode units 210 with extraction gates 240 are capable of emitting electron beams independently of any electric fields external to the cold cathode unit 210, if a constant dc potential drop is applied between the gate 240 and the emitter cone 220.

Figure 4:
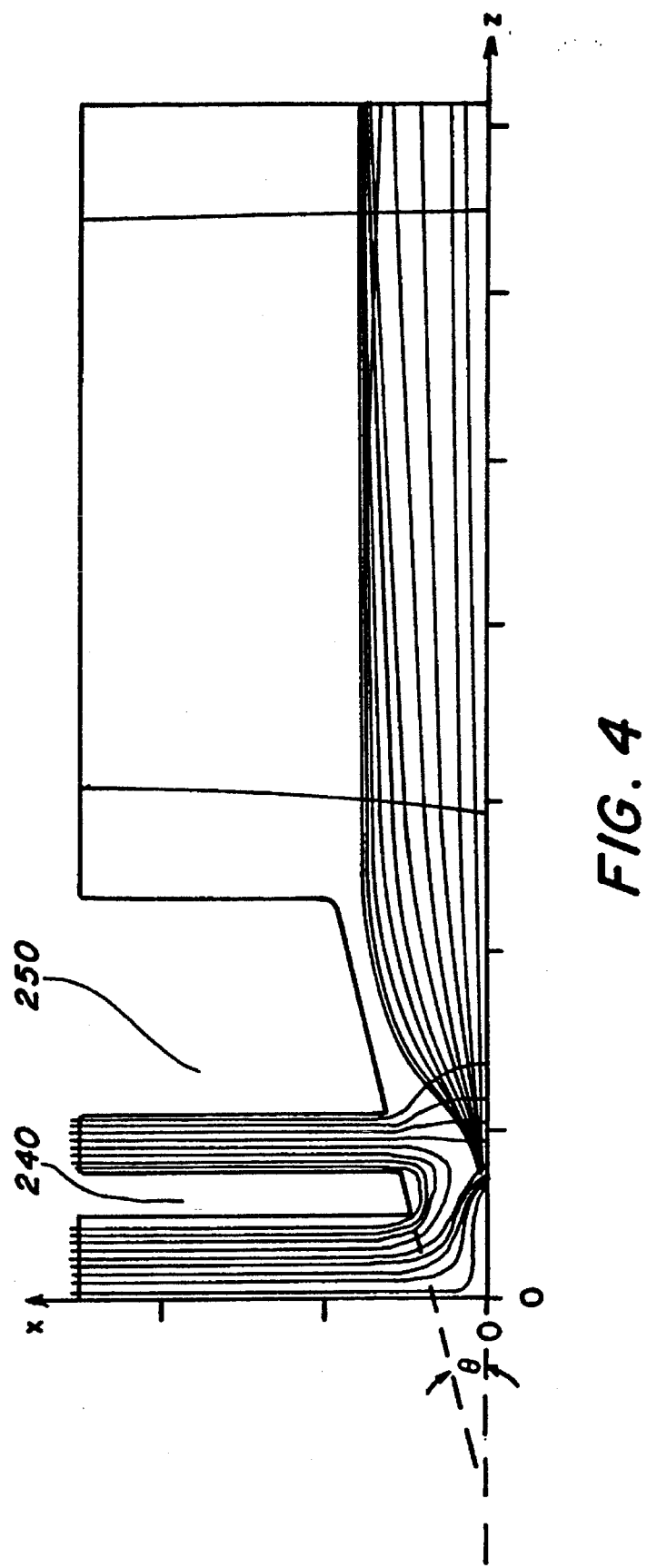
FIG. 4 demonstrates electron trajectories and equipotential lines for a cold cathode unit of FIGS. 1 and 3 having one lens electrode.

Referring now to FIG. 4, an example of a single lens electrode design for the focusing array 200 of FIG. 1 and 3 is shown. In this design, the gate 240 and the first lens electrode 250 are self-aligned. This example is referred to as having a sidewall lens. The generally horizontal and vertical lines of FIG. 4 depict electron trajectories and equipotentials, respectively, as determined by computer simulation. These trajectories and potentials are shown in cross-section through the x-z plane (FIG. 1) with the y-displacement selected so the x-z plane passes through the tip 215. The origin of the x-z plane is selected so as to coincide with the tip 215.

In this example, the surface of the emitter cone 220 forms an angle of 35° with respect to the vertical. Gate voltage $V_g=100$ V is applied to the gate 240, and the emitter cone 220 is considered ground, i.e., the reference voltage. $V_g$ is optimally between 90 V and 130 V. A first voltage, $V_1=3$ V, optimally 3–9 V, is applied to the first lens electrode 250, and so the input ribbon $R_i$ has 3 eV energy. The gate has thickness $t_g$ of 0.4 μm and the tip 215 is $t_{tip}=0.15$ μm above the bottom of the gate 240. The bottom of the first lens electrode 250 is $t_{g,1}=0.5$ μm above the top of the gate 240. The minimum diameters $d_g$ and $d_1$ of the openings for the gate 240 and the first lens electrode 250 are 1.3 μm and 1.8 μm, respectively. The thickness of the first lens electrode 250 is $t_1 = 2.6$ μm, which is related to $d_1$ as $t_1=1.44*d_1$. As shown in FIG. 4, the inside edge of the gate 240 and the first lens electrode 250 are each at an opening angle $\phi=15°$ with respect to the z-axis, and these inside edges fall along the same conic section. As further shown in FIG. 4, the inside opening of the lens electrode 250 is tapered and becomes larger as the distance from the tip 215 of the tip 215 increases. The distance between the gate 240 and the substrate 230 is $t_{s,g}$0.7 μm. The thickness $t_1$ of the first lens electrode 250 (2.6 μm) is considerably greater than the gate thickness $t_g$ (0.4 μm) and than the distance between the gate 240 and the first lens electrode 250 (0.5 μm). As described further below, an accelerating electric field of 2 V/μm, optimally 2–10 V/μm, is applied in the z-direction beyond the first lens electrode 250.

Further design considerations of this sidewall lens focusing array 200 shown in FIG. 3 are shown in the following TABLE 1.

TABLE 1

| Variable | Range |
|---|---|
| $d_g$ (μm) | 0.08–2.5 |
| $d_1$ (μm) | 0.08–2.5 |
| $t_{tip}$ (μm) | $-0.1 \leq t_{tip} \leq t_g + 0.2$ |
| $t_g$ (μm) (thickness decreases as diameter decreases from calculated value for gate diameter $d_g$ less than 1.0 μm) | 0.1–1.0 |
| $t_1/d_1$ (μm/μm) | 0.75–3.0 |
| $V_g$ (Volts) | 25–250 |
| $V_1$ (Volts) | 1–20 |
| $(V_g-V_1)/t_{g,1}$ (V/μm) | $(V_g-V_1)/t_{g,1} < V_{270}$, where $V_{270}$ is the breakdown voltage of the insulating spacer 270. For $SiO_2$, the typical breakdown voltage is $V_{270} = 250$–400 V/μm. |
| $V_g/t_{s,g}$ (V/μm) | $V_g/t_{s,g} < V_{260}$, where $V_{260}$ is the breakdown voltage of the insulating spacer 260. For $SiO_2$, the typical breakdown voltage is $V_{260} = 250$–400 V/μm. |
| $\phi$ (lens and gate opening angle) (°) | 0–45 |
| accelerating electric field in the z-direction beyond the first lens electrode 250 (V/μm) | 0.1–300 |

A sidewall lens focusing array 200 can be non-aligned as well as self-aligned, although the latter is preferable in terms of production. Manufacture of a self-aligned focusing array 200 generally takes fewer fabrication masks than manufacture of a non-aligned focusing array 200.

Figure 5:
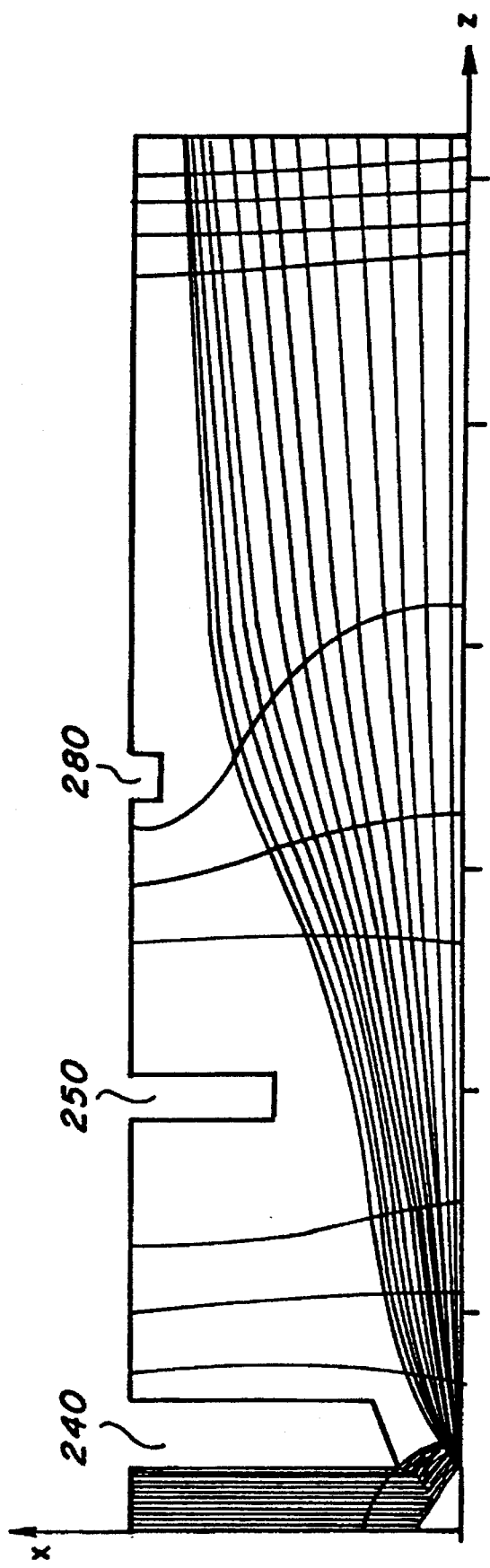
FIG. 5 demonstrates electron trajectories and equipotential lines for a cold cathode unit of FIG. 1 having two lens electrodes.

Referring now to FIG. 5, an example of a double lens electrode design for the focusing array 200 is shown. In addition to having a first lens electrode 250, this structure also has a second lens electrode 280 positioned above the first lens electrode 250, that is, further from the substrate 230. The generally horizontal and vertical lines of FIG. 5 depict electron trajectories and equipotentials, respectively, as determined by computer simulation. These trajectories and potentials are shown in cross-section through the x-z plane with the y-displacement selected so that the x-z plane passes through the tip 215. The origin of the x-z plane is selected so as to coincide with the tip 215. The optimal and preferred specification ranges for this design are shown in the following TABLE 2.

TABLE 2

| Variable | Most Preferred Range | Preferred Range |
|---|---|---|
| $d_g$ (μm) | 1.1 | 0.08–2.5 |
| $d_1$ (μm) | 3.4 | 0.08–10.0 |
| $d_2$ (μm): minimum opening of the second lens electrode 280 | 5.5 | 0.08–10.0 |
| $t_{tip}$ (μm) | 0.0 | $t_{tip} \leq t_g$ |
| $t_g$ (μm) | 0.7 | $0.45 \leq (t_g-t_{tip})/d_g \leq 1$ |
| $t_1$ (μm) | 0.4 | $t_1/d_1 < 0.2$ |
| $t_2$ (μm): thickness of the second lens electrode 280 | 0.4 | $t_2/d_2 < 2.0$ |
| $V_g$ (Volts) | 90–130 | 25–250 |
| $V_1$ (Volts) | 895 | $1 \ll V_1/V_g$ and $(V_1-V_g)/t_{g,1}$ is as large as possible |

TABLE 2-continued

| Variable | Most Preferred Range | Preferred Range |
|---|---|---|
| $V_2$ (Volts): Voltage of the second lens electrode 280 | 50 | $0 \leq V_2 \leq 100$; $V_2 < V_1$ |
| $t_{g,1}$ (µm) | 2.5 | $(V_1-V_5)/t_{g,1} < V_{270}$, where $V_{270}$ is the breakdown voltage of the insulating spacer 270. For $SiO_2$, the typical breakdown voltage is $V_{270} = 250$–$400$ V/µm. |
| $t_{1,2}$ (µm): distance between first lens electrode 250 and second lens electrode 280 | 2.47 | $(V_1-V_2)/t_{1,2} < V_{1,2}$, where $V_{1,2}$ is the breakdown voltage of the insulating spacer between the first and second lens electrodes 250 and 280. For $SiO_2$, the typical breakdown voltage is $V_{1,2} = 250$–$400$ V/µm. |
| $t_{s,g}$ (µm) | 0.7 | $V_g/T_{s,g} < V_{260}$, where $V_{260}$ is the breakdown voltage of the insulating spacer 260. For $SiO_2$, the typical breakdown voltage is $V_{260} = 250$–$400$ V/µm. |
| $\phi_g$ (°): gate opening angle | 22.5 | 0–45 |
| $\phi_1$, $\phi_2$ (°): opening angles for lens electrodes 250 and 280 | 0 | 0–45 |
| accelerating electric field in the z-direction beyond the second lens electrode 280 (V/µm) | 0 | 0–300 |

The configuration of the focussing array 200 of FIG. 1 is not necessarily limited to the embodiments shown in FIGS. 3, 4 or 5 so long as the focussing array 200 has the above-described properties.

Figure 6:
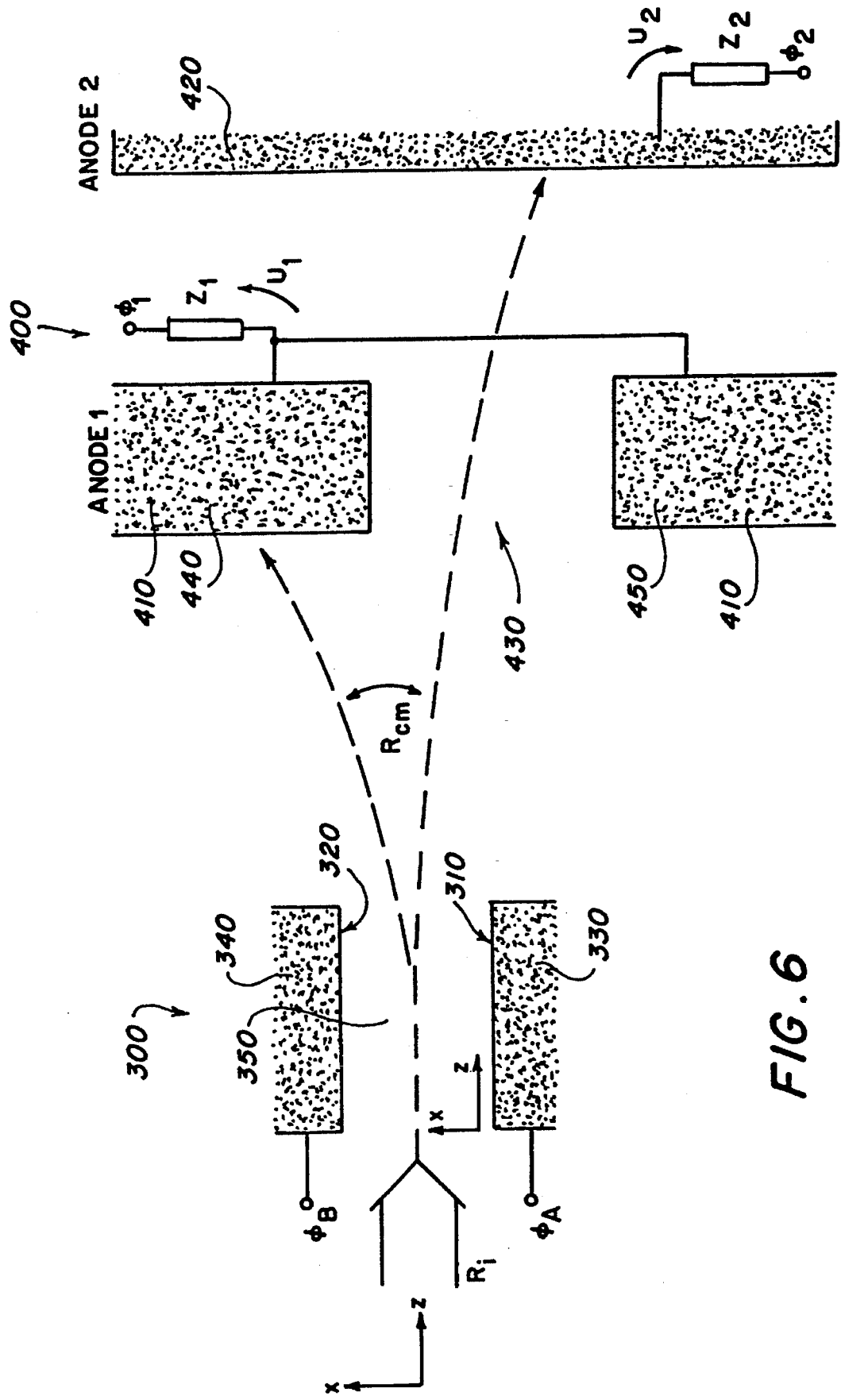
FIG. 6 is a side view of the deflection and anode sections of the deflection device of FIG. 1 suitable for use as a deflection amplifier.

Referring now to FIGS. 6 and 1, the deflection section 300 of an electron deflection device 100 includes first and second electrically conductive deflector faces 310 and 320, respectively disposed symmetrically with respect to the y-axis so as to face inward towards the y-axis. The first and second deflector faces 310 and 320 are supported on first and second deflector plates 330 and 340, respectively. An input electrical circuit (not shown) responsive to the electrical input signal $I_s$ is connected to the deflector plates 330 and 340 for applying electric potentials $\phi_A$ and $\phi_B$ to the first and second deflector faces 310 and 320, respectively.

The deflector faces 310 and 320 form a vacuum deflection region 350 therebetween, and are disposed so that the z-axis passes through the deflection region. As a result of the input electrical circuit's application of potentials $\phi_A$ and $\phi_B$ to the deflector faces 310 and 320, respectively, the deflection section 300 produces an electric field E in the deflection region 350.

The electrical input circuit provides time varying potentials $\phi_A$ and $\phi_B$ so that the potential difference $\phi_A-\phi_B$, i.e. the modulation voltage, and therefore the x-component $E_x$ of the electric field E in the deflection region 350, is proportional to the ac component of the input signal $I_s$. The maximum amplitude of the modulation voltage, i.e. the variation $\Delta V_m$ of the modulation voltage, is typically on the order of a tenth of a Volt to a few Volts, and preferably less than 4 Volts. The peak of the electric field component $E_x$ is typically in the range 5–500 mV/µm. This small modulation voltage makes higher frequency operation and higher gain feasible.

The dc values of the applied potentials $\phi_A$ and $\phi_B$ can provide an appropriate field between the focusing array 200 and the deflector sector, such as the accelerating field referred to earlier.

It is preferable that the potentials $\phi_A$ and $\phi_B$ be applied to the deflector faces 330 and 340, respectively, so that the potentials propagate in the x-direction, but they can also be applied so as to propagate in the y-direction.

The modulated electric field E transversely deflects the input ribbon $R_i$ in the x-direction to produce a continuously modulated output ribbon $R_{cm}$. Although the input ribbon $R_i$ is propagated with constant velocity in the z-direction, the deflection section 300 transversely deflects the input ribbon $R_i$ to produce the continuously modulated output ribbon $R_{cm}$ propagating in time-varying directions. The deflection section 300 provides a modulated x-component of the beam velocity of ribbon $R_{cm}$.

The specifications of the deflection section 300 are selected so as to satisfy the above conditions. In order to effectively deflect the input ribbon $R_i$ in the x-direction, the deflector faces 310 and 320 should be at least as long in the y-direction (perpendicular to the x-z plane) as the input ribbon $R_i$ is. This y-dimension is approximately the size of the focusing array 200 in the y-direction.

In order to effectively modulate the input ribbon $R_i$ at high frequencies, the transit time $L_z/v_z$ of electrons passing through the deflection region 350 should be short with respect to $1/f$, where $L_z$ is the z-dimension of the deflector faces 320 and 340, $v_z$ as stated earlier, is the z-component of the electron velocity, and f is the frequency of the ac component of the input signal $I_s$. The z-dimension $L_z$ of the deflector faces 310 and 320 is typically on the order of tens of µm. The factor $\theta=\omega L_z/v_z$ is a normalized measure of the z-dimension of the deflector faces 320 and 340, where $\omega=2\pi f$ is the angular frequency of the input signal $I_s$. The factor $\theta$ is preferably in the range $0<\theta\leq\pi$.

The gap in the x-direction between deflector faces 310 and 320, i.e., the x-size of the deflection region 350, should be as small as possible and yet large enough to accommodate the width of the input ribbon $R_i$ (which is preferably under 200 µm and most preferably under 10 µm) and provide room for deflection so that the input ribbon $R_i$ does not physically intercept any structural part of the deflection section 300. A small gap between deflector faces 310 and 320 maximizes the electric field component $E_x$ in the deflection region 350 so as to maximize deflection of the input ribbon $R_i$ and thereby maximize the amplifier gain.

Space charge effects become significant as the line current density $\Delta I/\Delta y$ of the input ribbon $R_i$ increases, based on the following relation:

$$\left(\frac{\Delta I}{\Delta y}\right)_{max} \cong \frac{8\epsilon_0}{3D}\left(\frac{2e}{3m_e}\right)^{1/2} \cdot V_i^{3/2},$$

where e is the absolute value of the elementary electron charge, $m_e$ is the electron mass, $\epsilon_0$ is the free space permeability, $eV_i$ the electron energy in units of electron Volts (eV), D is the gap between deflectors 330 and 340, and the electron beam is located in the center between the deflectors 330 and 340. For $eV_i=10$ eV, D=8 µm, and the average potential of deflectors 330 and 340 is 10 V, then the space charge effect becomes important as the line current density exceeds 10 µA/µm, and becomes detrimental as the line current density approaches 30 µA/µm. Therefore, the focusing array 200 produces an input ribbon having line current density as large as possible but less than $(\Delta I/\Delta y)_{max}$ as specified in the above relation.

A feature of the electron deflection device 100 is that the input ribbon $R_i$ produced by the focusing array 200 is focused to a very thin sheet, and the continuously modulated output ribbon $R_{cm}$ produced by the deflection section 300 remains focused to a very thin sheet as far as the anode section 400.

The anode section 400 responsive to the continuously modulated output ribbon $R_{cm}$ for producing the output signal $U_s$ includes a first anode 410 and a second anode 420 positioned and designed so that the electron beam $R_{cm}$ intercepts the first anode 410 during part of the deflection cycle and the second anode 420 during part of the deflection cycle. The first anode 410 is loaded with potential $\phi_1$ and impedance $Z_1$, and the second anode 420 is loaded with potential $\phi_2$ and impedance $Z_2$. As a result of the electron beam $R_{cm}$ intercepting the anodes 410 and 420, the anode section 400 produces first and second electrical output signals $U_1$ and $U_2$, respectively. These signals $U_1$ and $U_2$ can be selectively combined to constitute the output signal $U_s$.

The first and second anodes 410 and 420 are each disposed in the path of the continuously modulated output ribbon $R_{cm}$. The first anode 410 is disposed closer to the deflection section 300 than the second anode 420.

The first anode 410 is loaded with potential $\phi_1$ selected so that it is on an equipotential surface with respect to the second anode 420. For example, if the second anode 420 were loaded at $\phi_2=150$ V and were disposed 85 μm from a deflection section 300 having a dc bias of 10 V, then a first anode 410 disposed 45 μm from the deflection section 300 would be loaded at $$\phi_2 = 10V + \left[ (150V - 10V) \times \frac{45 \text{ μm}}{85 \text{ μm}} \right] \approx 84V.$$

The applied potentials $\phi_1$ and $\phi_2$ are further selected so that $\phi_A$, $\phi_B$, $<<\phi_1-I_1\cdot Z_1$ and $\phi_1 \approx <\phi_2-I_2\cdot Z_2$, are the peak total current to the first and second anodes 410 and 420, respectively. These conditions minimize anode loading problems caused by electron repulsion from the anodes due to voltage depression resulting from output current $I_1$ or $I_2$.

The second anode 420 can be a single plate. The first anode 410 provides a slit 430 for passage of the continuously modulated output ribbon $R_{cm}$ to pass therethrough during part of the deflection cycle. As shown in FIG. 6, the first anode 410 includes sections 440 and 450 with the slit 430 therebetween, asymmetrically positioned and designed so that the continuously modulated output ribbon $R_{cm}$ intercepts section 440 during part of the deflection cycle and does not intercept section 450 during any part of the deflection cycle. Sections 440 and 450 can be separate plates or different sections of a single plate containing a slit 430. Section 450 serves to balance the electric field near the anode section 400 so that equipotential surfaces are generally perpendicular to the path of the continuously modulated output ribbon $R_{cm}$.

Figure 7:
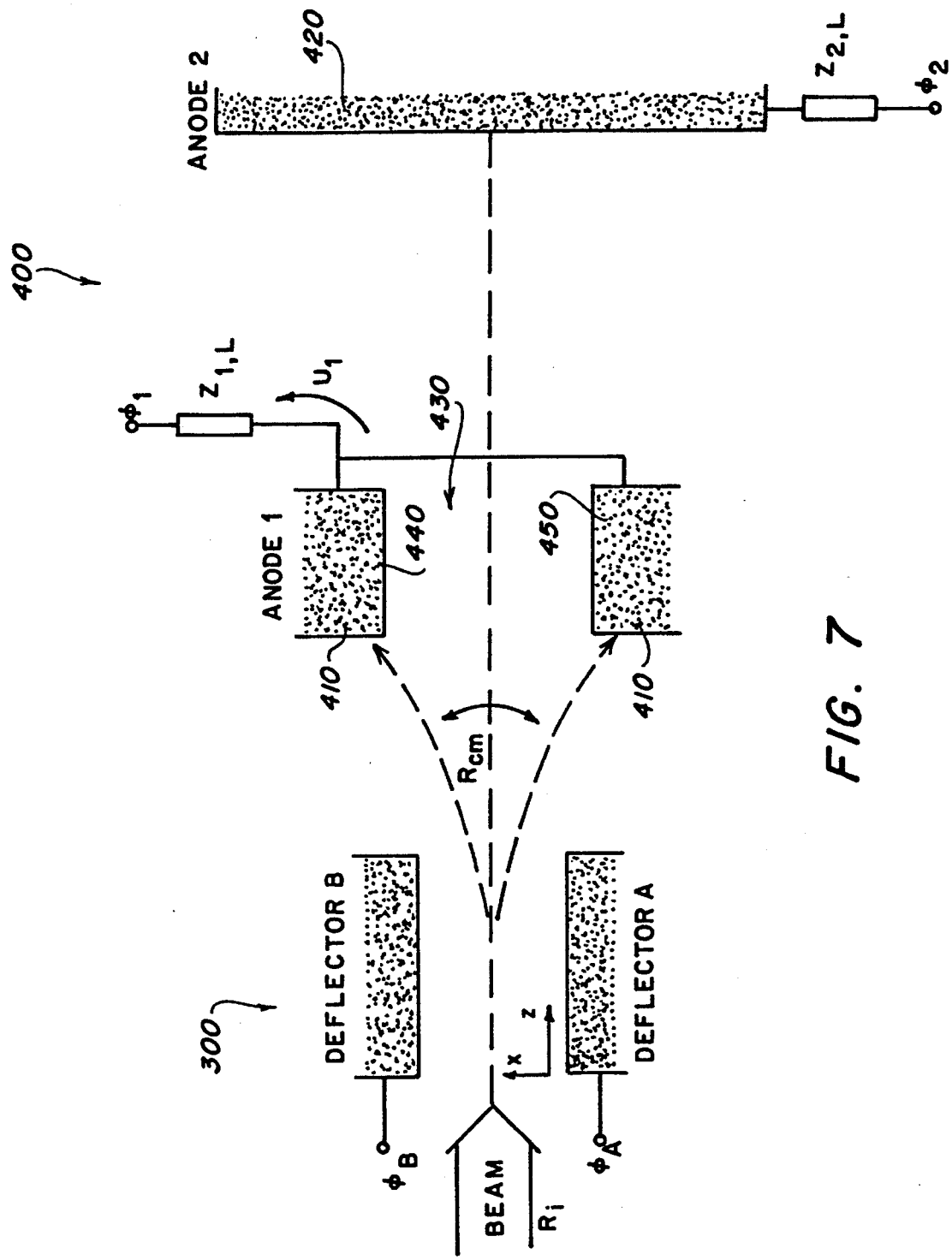
FIG. 7 is a side view of the deflection and anode sections of the deflection device of FIG. 1 suitable for use as a frequency doubling deflection amplifier.

Referring now to FIG. 7, a configuration of anode section 400 is shown in which the continuously modulated output ribbon $R_{cm}$ strikes the first anode 410 during at least two separate parts of the deflection cycle and passes through the slit 430 during another part of the deflection cycle. Sections 440 and 450 can be symmetrically disposed about the path of the continuously modulated output ribbon $R_{cm}$. Just as in the configuration shown in FIG. 6, sections 440 and 450 can be separate plates or different sections of a single plate containing a slit 430. The output signal $U_s$ for such a configuration has a frequency twice that of the input signal $I_s$ frequency. The load parameters $\phi_1$, $\phi_2$, $Z_1$ and $Z_2$ satisfy the same conditions as the device shown in FIG. 6.

It is not necessary that the first anode 410 be asymmetric as shown in FIG. 6 in order to produce an output signal $U_s$ of the same frequency as the input signal $I_s$, or that the first anode 410 be symmetric as shown in FIG. 7 in order to produce an output signal $U_s$ of twice the input signal $I_s$ frequency. The same results could be achieved by applying a bias between the first and second deflector faces 310 and 320 and shifting the slit 430, or by using some combination of bias and slit 430 position.

A person of ordinary skill in the art may readily design an anode section 400 for use in an electron deflection device 100 of the present invention so as to be responsive to the continuously modulated output ribbon $R_{cm}$ for producing an output signal $U_s$. For example, rather than loading the first and second anodes 410 and 420 with potentials $\phi_1$ and $\phi_1$ and impedances $Z_1$ and $Z_2$, respectively, inductive bias chokes (not used) could be used. As another example, anode sections 440 and 450 could be loaded with different impedances.

Figure 8:
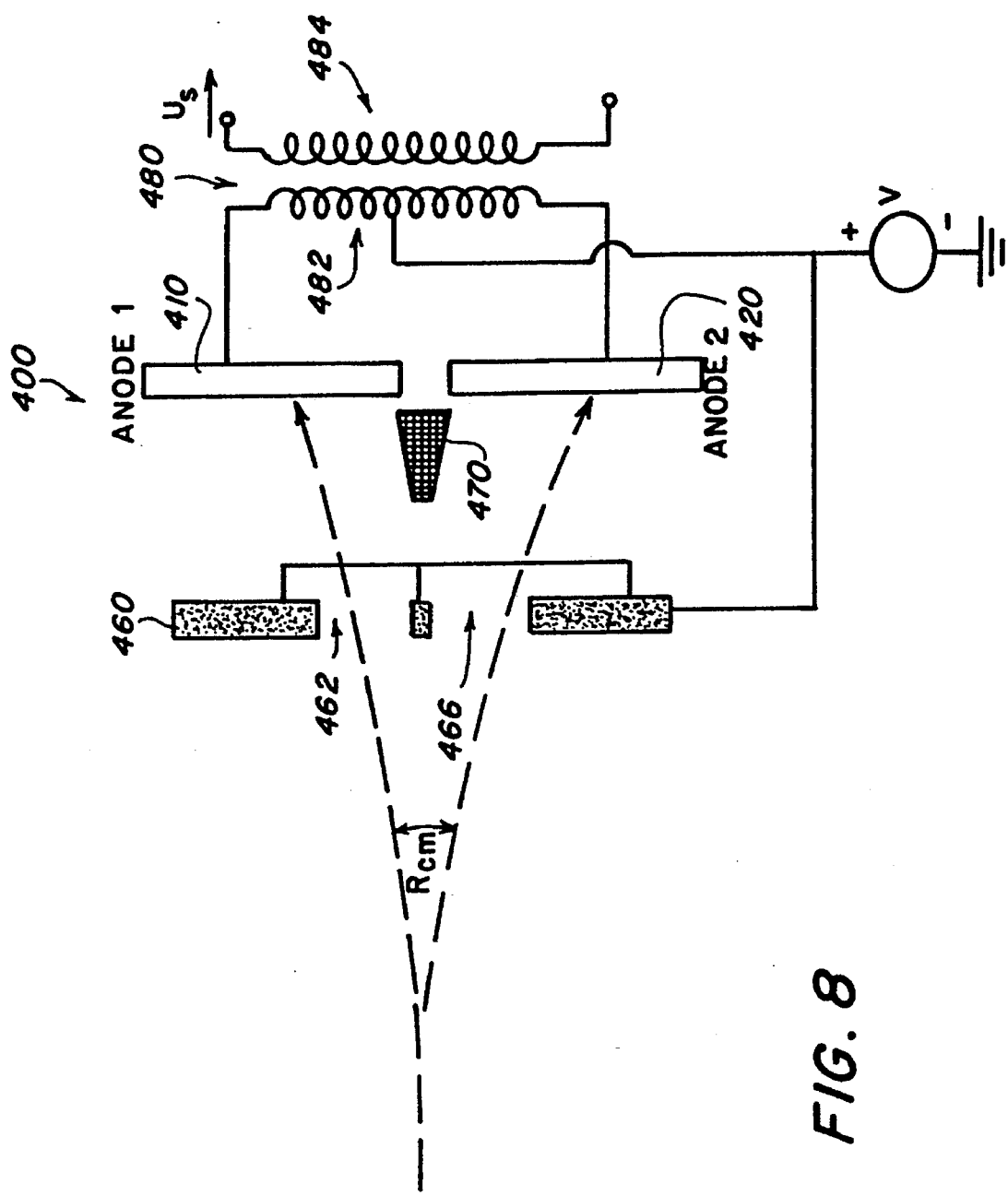
FIG. 8 is a side view of the anode section of the deflection device of FIG. 1 suitable for use as a deflection amplifier, the anode section being of the push-pull configuration.

As a further example, the push-pull configuration of U.S. Pat. No. 2,553,753 to Adler, designed for use with a thermionic emitter, may be readily adapted for use with a cold cathode unit 200 (FIGS. 1, 3). Referring now to FIG. 8, an acceleration voltage, for example 90 V, is applied to an accelerating electrode 460, which includes slots 462 and 466 for passage of the continuously modulated output ribbon $R_{cm}$ therethrough. A beam splitting element 470 series to divide the projected beam $R_{cm}$ into two portions so that the ribbon $R_{cm}$ intercepts the first anode 410 during part of the deflection cycle and the second anode 420 during another part of the deflection cycle. The first anode 410 and the second anode 420 are connected across a primary winding 482 of a center-tap transformer 480, the center tap being held at the accelerating voltage. A secondary winding 484 of the transformer 480 produces the output signal $U_s$.

The above designed electron deflection device 100 may be used as in amplifier in the microwave range. Other uses may be readily determined by a person of ordinary skill in the art. For example, it may also be used as an oscillator in the microwave range. When so used, the factor $\theta=\omega L_z/v_z$ is preferably in the range $2\pi<\theta \leq 2.86\pi$, and most preferably $\theta=2.5\pi$.

Figure 9:
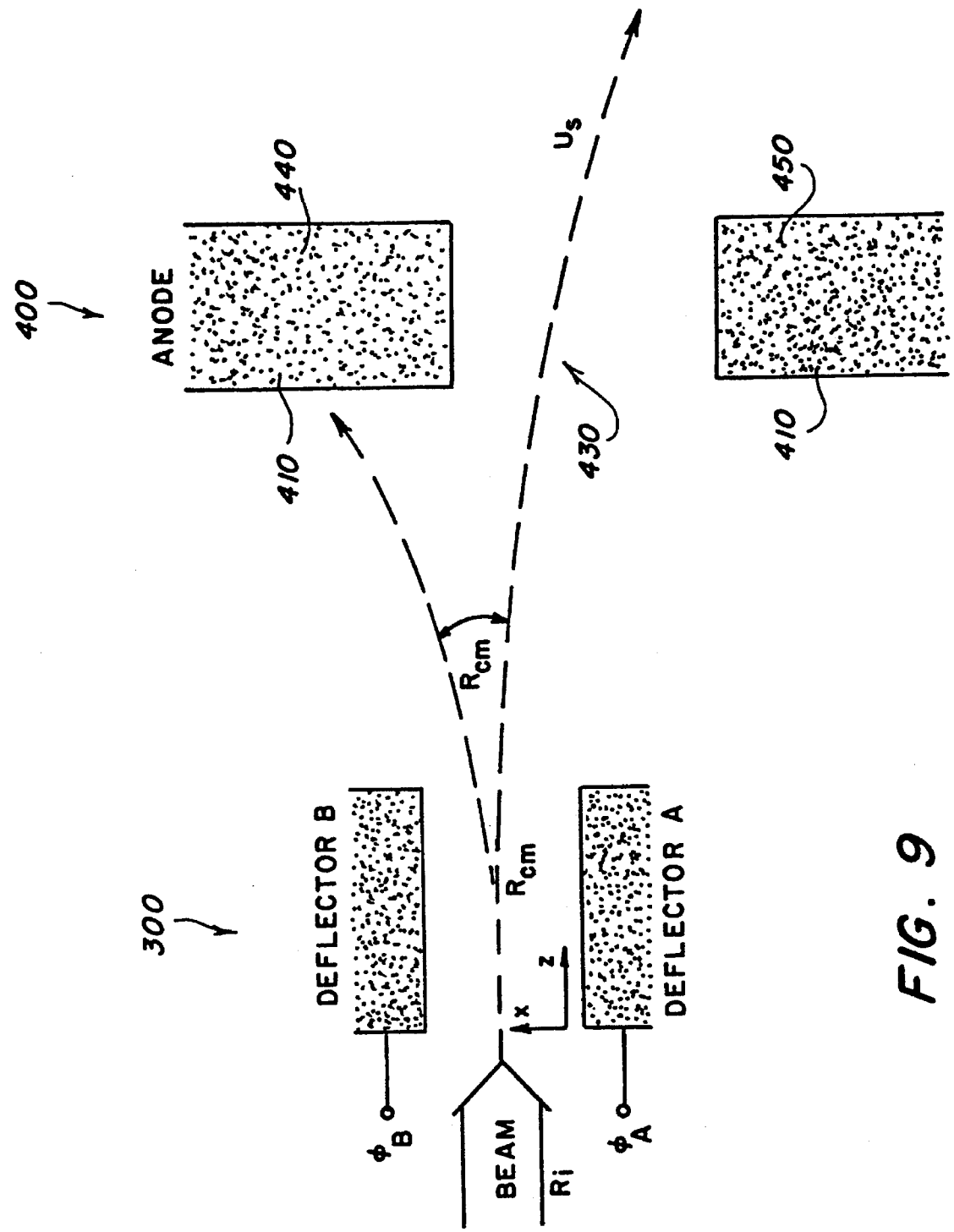
FIG. 9 is a side view of the deflection and anode sections of the deflection device of FIG. 1 suitable for use as an electron beam source.

Referring now to FIGS. 9 and 1, an electron deflection device 100 is shown which is suitable for use as a modulator or beam source to produce a chopped output ribbon $U_s$. The output ribbon is suitable for input to a high power amplifier, such as a klystron, klystrode, traveling wave tube, distributed amplifier or a gigatron, or to a free electron laser.

The anode section 400 of the device shown in FIG. 9 comprises a first anode 410 comparable to the first anode 410 of the deflection amplifier shown in FIG. 6 and described earlier. The first anode 410 is positioned and designed so that the electron beam $R_{cm}$ intercepts the first anode 410 during part of the deflection cycle. The first anode 410 provides a slit 430 for passage of the continuously modulated output ribbon $R_{cm}$ therethrough during another part of the deflection cycle, thereby producing the output ribbon $U_s$. The first anode 410 includes sections 440 and 450 with the slit 430 therebetween, asymmetrically positioned and designed so that the continuously modulated output ribbon $R_{cm}$ intercepts section 440 during part of the deflection cycle and does not intercept section 450 during any part of the deflection cycle. Section 450 serves to balance the electric field near the anode section 400 so that equipotential surfaces are generally perpendicular to the path of the continuously modulated output ribbon $R_{cm}$.

Figure 10:
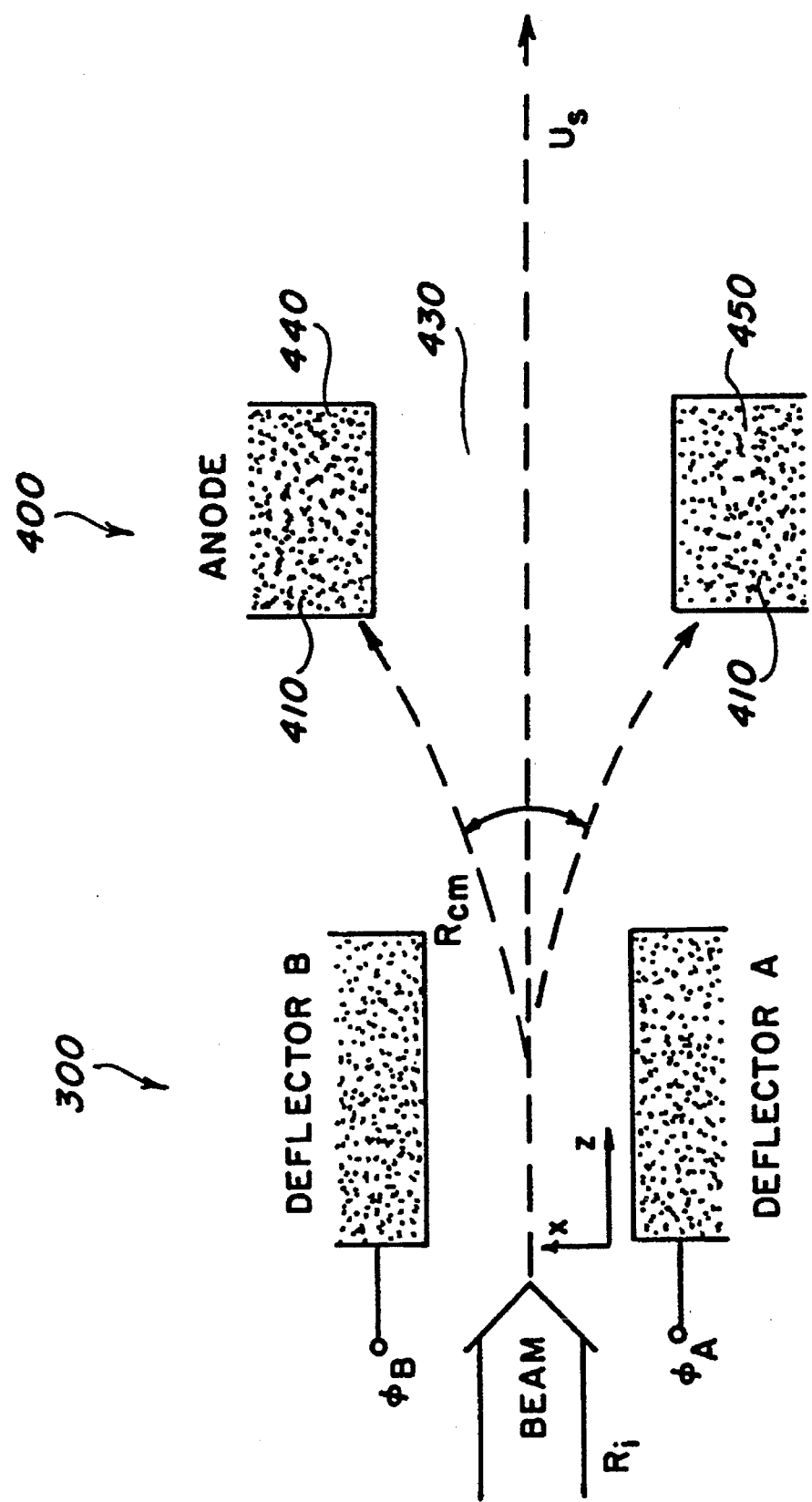
FIG. 10 is a side view of the deflection and anode sections of the deflection device of FIG. 1 suitable for use as an electron beam source.

Referring now to FIGS. 10 and 1, an electron deflection device 100 is shown which also is suitable for use as a modulator or beam source to produce a chopped output ribbon $U_s$. The anode section 400 comprises a first anode 410 comparable to the first anode 410 of the deflection amplifier shown in FIG. 7 and described earlier. The anode section 400 is designed so that the continuously modulated output ribbon $R_{cm}$ strikes the first anode 410 during at least two separate parts of the deflection cycle. Just as in the configuration shown in FIG. 9, the first anode 410 provides a slit 430 for passage of the continuously modulated output ribbon $R_{cm}$ therethrough during part of the deflection cycle, thereby producing the output ribbon $U_s$. The output ribbon $U_s$ for such a configuration has a frequency double the frequency of the input signal $I_s$. Sections 440 and 450 can be symmetrically disposed about the path of the continuously modulated output ribbon $R_{cm}$.

A simulated example of this configuration uses a drive frequency of 40 GHz to produce an 80 GHz prebunched chopped output ribbon $U_s$. In this example, the gap 430 of the first anode 410 is 10 µm. The first anode 410 is 45 µm from the deflector section 430 and is at potential $\phi_1$=90 V. A modulation voltage variation of $\Delta V_m$=4 V is applied to an input ribbon $R_i$ having current of 7 mA.

Figure 11:
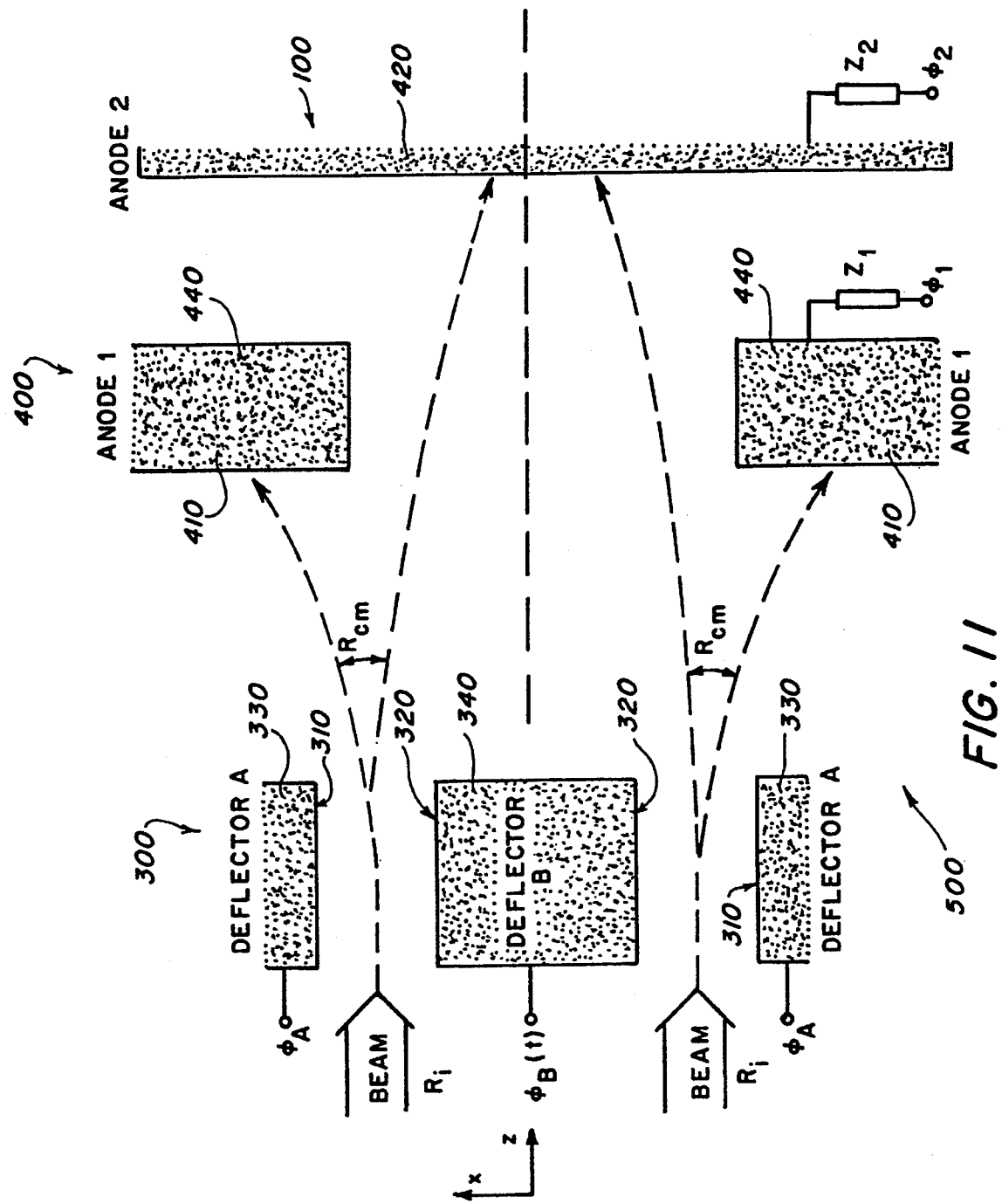
FIG. 11 is a side view of the deflection and anode sections of a multiple beam deflection device suitable for use as a deflection amplifier.

Referring now to FIG. 11, part of a multiple beam device is shown which is suitable for use as a deflection amplifier. This multiple beam device includes at least 2 units 100 comparable to the devices 100 as shown in FIGS. 1, 3 and 6. The at least two devices 100 are spaced apart in the x-direction and integrated as appropriate so that adjacent continuously modulated output ribbons $R_{cm}$ are deflected in opposite directions. For example, adjacent focusing arrays 200 may share a common substrate 230, insulating spacers 260 and 270, and parts of the lens electrode 250. Adjacent deflection sections 300 may have a common deflector plate 340. Adjacent anode sections 400 may have a common second anode 420. The first anode 410 shown in FIG. 11 differs from the first anode 410 shown in FIG. 6 in that adjacent first anodes 410 (FIG. 6) will have a total of two slits 430 and four sections 440 and 450 (FIG. 6), and can be combined to constitute a first anode 410 (FIG. 11) having one slit 430 and two sections 440 (FIG. 11).

Another configuration for a multiple beam device which is suitable for use as a deflection amplifier also includes at least 2 units 100 comparable to the devices 100 as shown in FIGS. 1 and 3 and spaced apart in the x-direction. Unlike the configuration shown in FIG. 11, the adjacent devices 100 are integrated as appropriate so that adjacent continuously modulate output ribbons $R_{cm}$ are deflected in the same direction. Such a multiple beam device is essentially a combination of devices as shown in FIGS. 1, 3, and 6, 7 or 8. If it includes devices 100 comparable to those shown in FIGS. 1, 3 and 7, the output frequency can be double the input frequency.

Multiple deflection devices suitable for use as a modulator or beam source for producing at least two chopped output ribbons $U_s$ include at least 2 units 100 comparable to the devices 100 as shown in FIGS. 1, 3, 9 and 10. The at least two devices 100 are spaced apart in the x-direction and integrated as appropriate so that adjacent continuously modulate output ribbons $R_{cm}$ are deflected in opposite directions. Just as shown in FIG. 11, adjacent focusing arrays 200 may share a common substrate 230, insulating spacers 260 and 270, and parts of the lens electrode 250. Adjacent deflection sections 300 may have a common deflector plate 340 and adjacent anode sections 400 may have common first anodes 410. If it includes devices 100 comparable to those shown in FIGS. 1, 3 and 10, the output frequency can be double the input frequency.

Another design for multiple deflection devices suitable for use as a modulator or beam source for producing at least two chopped output ribbons $U_s$ includes at least 2 units 100 comparable to the devices 100 as shown in FIGS. 1, 3 and 9 or 10. The at least two devices 100 are spaced apart in the x-direction and integrated as appropriate so that adjacent continuously modulate output ribbons $R_{cm}$ are deflected in the same direction.

The following results have been obtained from computer simulations of this invention using software MAGIC and EGUN2. MAGIC is available from Mission Research Corp., Newington, Va. 22122; EGUN is discussed in W. B. Hermannsfeldt, "EGUN—An Electron Optics and Gun Design Program," SLAC Report 331 (1988).

Using the configuration of FIG. 6 with an input ribbon having a current of 14 mA and energy 10 eV, the required input power for each deflector is $3.2*10^{-4}$ W while the output power is $2.45*10^{-3}$ W, yielding a power gain of 7.66. The gain bandwidth product is G$\Delta$f=2.2 GHz.

For input ribbon having 2A current, and multiple units being connected together as discussed above as a multiple beam deflection amplifier, the gain bandwidth product is G$\Delta$f=300 GHz, and the power gain is 819. The device operates at an rf power efficiency of 15%.

Further computer simulated examples also use the configuration shown in FIG. 6 and frequency 10 GHz, but have longer deflector faces 310 and 320 in the z-direction as measured by the factor $\theta=\omega L_z/v_z$. In these examples, the line current density is 20 µA/µm, the input ribbon $R_i$ has width $\delta x$=10 µm and energy 34 eV, $\Delta V_m$=0.24 V, short circuit current gain bandwidth product $f_T$=60 GHz, and the gap between deflector faces 310 and 320 is D=20 µm. For $\theta=\pi$, $L_z$=170 µm, $\Delta V_m$=0.24 V, and $f_T$=60 GHz. For $\theta=\pi/2$, $L_z$=85 µm, $\Delta V_m$=0.34 V, and $f_T$=155 GHz. As $\theta$ approaches 0, $f_T$ approaches 260 GHz. This result is further described in C. M. Tang, Y. Y. Lau, T. A. Swyden, "Deflection Microwave Amplifier with Field Emission Arrays," submitted to International Electronics Device Meeting '93, which paper is incorporated herein by reference.

A simulation of 40 GHz amplification uses anode voltages of $\phi_1$=90 V and $\phi_2$=120 V, modulation voltage variation $\Delta V_m$=2 V, input ribbon current 375 mA, and loads $Z_1$=$Z_2$= 200Ω. The first and second anodes 410 and 420, are 30 µm and 55 µm, respectively, from the deflection section 300. The simulation shows that using multiple units of this configuration to obtain total input beam $R_i$ current of 375 mA provides gain bandwidth product of G$\Delta$f=165 GHz and power gain of 24. The device operates at an rf power efficiency of 24%.

It is understood that many other changes and additional modifications of the invention are possible in view of the teachings herein without departing from the scope of the invention as defined in the appended claims.

What is claimed is:

1. A deflection device responsive to a microwave input signal for producing an output signal, said deflection device comprising:

(a) a focusing array for producing a collimated electron beam input ribbon in the direction of a propagation axis, the input ribbon being elongated along an array axis perpendicular to the propagation axis and being relatively thin along a deflection axis perpendicular to the array axis and to the propagation axis, said focussing array comprising a plurality of cathode units, each cathode unit comprising means independent of any electric fields external to said cathode unit for emitting an electron beamlet and means for focussing the beamlet, the plurality of focussed beamlets produced by said plurality of cathode units constituting the input ribbon;

(b) first and second deflector faces, said first and second deflector faces forming a deflection region therebetween and being disposed so that the propagation-axis passes through said deflection region, said deflection region being external to said focussing array, said first and second deflector faces and said focussing array (a) constituting an integrated structure;

(c) means responsive to the input signal for applying time varying first and second potentials to said first and second deflector faces, respectively, so as to produce a modulated electric field in said deflection region for deflecting the input ribbon over the course of a temporal deflection cycle to produce a continuously modulated output ribbon of substantially the same frequency as the input signal; and (d) an anode section responsive to the continuously modulated output ribbon for producing a microwave output signal having frequency of substantially the same order of magnitude as the input signal frequency.

2. The deflection device of claim 1 wherein said focusing array comprises means for producing a highly collimated input ribbon of at most $1000*10^{-3}\pi$ millimeter-milliradians normalized emittance.

3. The deflection device of claim 2 wherein said focusing array comprises means for producing an input ribbon with thickness in the direction of the deflection axis of at most 200 μm, and energy of at most 50 electron Volts.

4. A multiple beam deflection device responsive to microwave input signal for producing an output signal, said multiple beam deflection device comprising a plurality of deflection devices of claim 1 having the same deflection axis and being sequentially disposed along the deflection axis so that said deflection means of element c) deflects adjacent continuously modulated electron ribbons in opposite directions.

5. A multiple beam deflection device responsive to a microwave input signal for producing an output signal, said multiple beam deflection device comprising a plurality of deflection devices of claim 1 having the same deflection axis and being sequentially disposed along the deflection axis so that said deflection means of element c) deflects adjacent continuously modulated electron ribbons in the same direction.

6. The deflection device of claim 1 wherein said focusing array comprises a linear array of a plurality of cold cathode units regularly disposed along the array axis.

7. The deflection device of claim 6 wherein said cold cathode units are vacuum-cone-type cold cathode units.

8. The deflection device of claim 6 wherein said cold cathode units are wedge-type cold cathode units.

9. The deflection device of claim 6 wherein said cold cathode units are edge-type cold cathode units.

10. The deflection device of claim 7 wherein said cold cathode units each comprise:

a tip and a gate, said tip and gate being maintained at a constant dc potential difference with respect to each other for extracting electrons from said tip; and at least one lens electrode maintained at a constant dc potential with respect to said tip and said gate for focusing the extracted electrons.

11. The deflection device of claim 8 wherein said cold cathode units each comprise a wedge-type cold cathode unit with at least one lens electrode.

12. The deflection device of claim 10 wherein said cold cathode units each comprise at least two lens electrodes each maintained at a constant dc potential with respect to said tip and said gate for focusing the extracted electrons.

13. The deflection device of claim 1 wherein said anode section comprises at least one anode responsive to the continuously modulated electron ribbon for producing an electrical output signal.

14. The deflection device of claim 13 wherein said at least one anode comprises at least a first and a second anode.

15. The deflection device of claim 14 wherein said at least one anode comprises at least a first and a second anode for producing a first and a second output signal, respectively.

16. The deflection device of claim 14 wherein said first anode comprises at least a first and a second anode section for producing an output signal of substantially twice the frequency of the input signal frequency.

17. The deflection device of claim 1 wherein said anode section comprises at least one slit for passage of the continuously modulated electron ribbon therethrough for producing a chopped output ribbon.

18. The deflection device of claim 17 wherein said anode section comprises at least one slit for passage of the continuously modulated electron ribbon therethrough for producing a chopped output ribbon of substantially twice the frequency of the input signal frequency.

* * * * *